United States Patent [19]

Kraus

[11] Patent Number: 4,797,883
[45] Date of Patent: Jan. 10, 1989

[54] ENCODING OR DECODING CIRCUIT FOR TIME DIVISION MULTIPLEX AND SIMULTANEOUS SIGNALS

[75] Inventor: Uwe E. Kraus, Eindhoven, Netherlands

[73] Assignee: U.S. Philips Corporation, New York, N.Y.

[21] Appl. No.: 840,366

[22] Filed: Mar. 17, 1986

[30] Foreign Application Priority Data

Mar. 22, 1985 [NL] Netherlands ............... 8500841

[51] Int. Cl.$^4$ .................. H04J 3/00; H04J 3/04; H04N 11/20
[52] U.S. Cl. ............................ 370/109; 370/112; 358/11
[58] Field of Search ............ 370/112, 109, 84, 100; 381/29, 32; 307/243, 244; 328/104, 105; 358/11; 364/200, 900

[56] References Cited

U.S. PATENT DOCUMENTS

| | | | |
|---|---|---|---|
| 4,264,954 | 4/1981 | Briggs et al. | 364/200 |
| 4,316,061 | 2/1982 | Ahamed | 370/109 |
| 4,320,501 | 3/1982 | LeDieu et al. | 370/63 |
| 4,593,390 | 6/1986 | Hildebrand et al. | 307/243 |

Primary Examiner—Douglas W. Olms
Assistant Examiner—Frank M. Scutch, III
Attorney, Agent, or Firm—Edward W. Goodman; Gregory P. Gadson

[57] ABSTRACT

A circuit includes shift registers (SR1, SR2, SR3) having different write and read rates under the control of clock pulses of different frequencies so that they form part of a signal compression or signal expansion circuit for encoding from simultaneous signals to the time division multiplex signal and for decoding from the time division multiplex signal to the simultaneous signals, respectively. The circuit is an integrated circuit (IC) having shift registers (SR1, SR2, SR3) suitable for both series-in, parallel-out and parallel-in, series-out operation. The shift register (SR1) with the greatest number of register stages is coupled to parallel connections of at least two further shift registers (SR2, SR3) via a through-connection circuit SC1 for a parallel bi-directional connection of the register stages. The series inputs and series outputs of at least the three shift registers are each coupled to a connection terminal of the integrated circuit (IC).

4 Claims, 1 Drawing Sheet

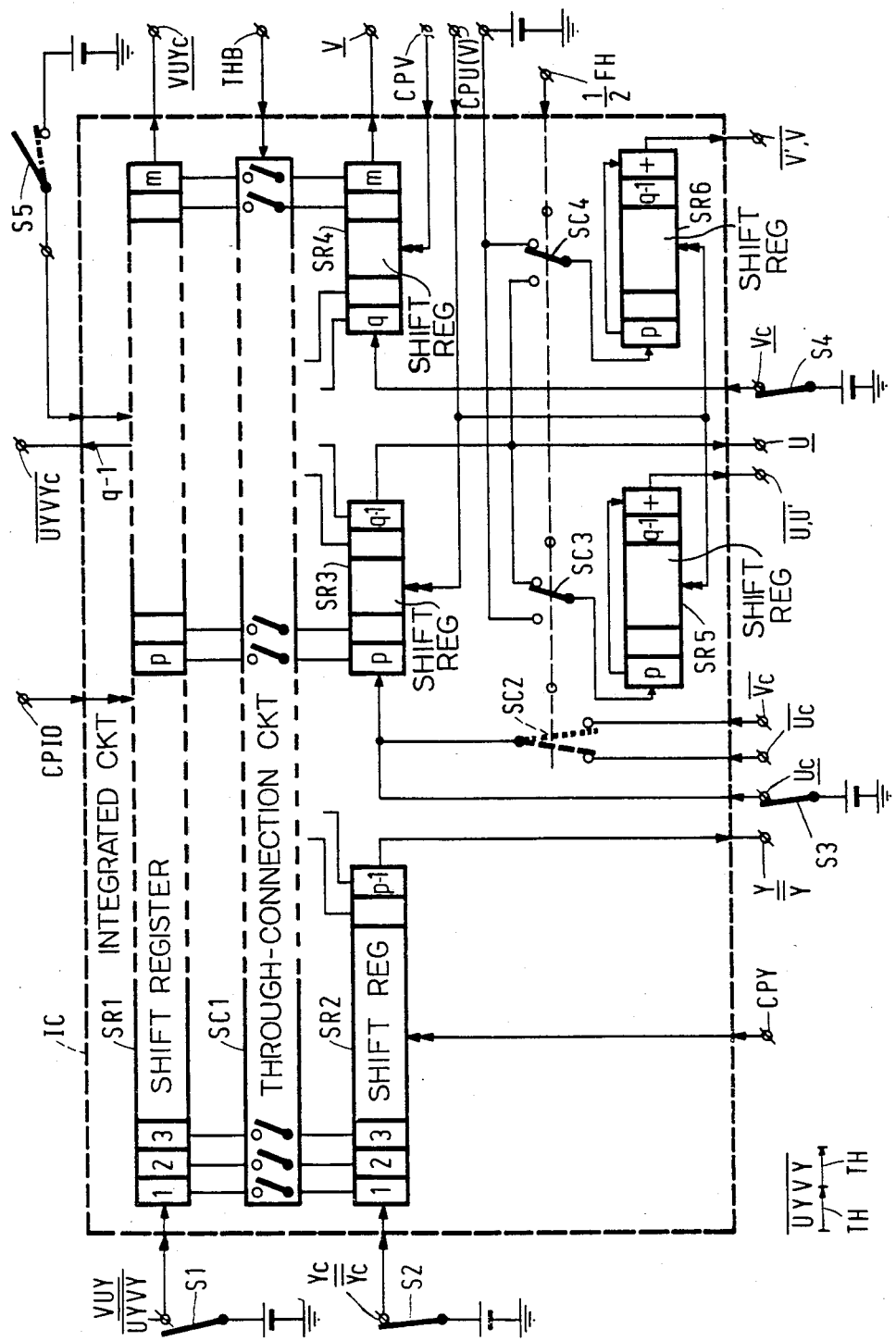

ENCODING OR DECODING CIRCUIT FOR TIME DIVISION MULTIPLEX AND SIMULTANEOUS SIGNALS

BACKGROUND OF THE INVENTION

The invention relates to an encoding or decoding circuit for time division multiplex and simultaneous or parallel signals, including shift registers having different write and read rates under the control of clock pulses of different frequencies, said shift registers forming part of a signal compression or signal expansion circuit, respectively, for encoding from simultaneous signals to the time division multiplex signal or for decoding from the time division multiplex signal to the simultaneous signals, respectively.

A circuit of this type is suitable for use in, for example, a transmission system which has been described in a public report "Experimental and Development Report 118/82" by the British "Independent Broadcasting Authority" (I.B.A.), entitled "MAC: A Television System for High-Quality Satellite Broadcasting". The report gives several variants for a so-called MAC (Multiplexed Analogue Component) picture coding. As is apparent from a survey table on page 9 of the report, it holds for all variants that the luminance and chrominance information in a television transmitter each undergo a time compression with the aid of a shift register, with the compression for the chrominance information being twice that of the luminance information. The chrominance information comprises two components per television line period and alternately one of the two occurs compressed in time in the time division multiplex coded signal. The luminance information associated with each line period is present in a time-compressed state in this signal. For the time compression associated with the luminance information the report gives the factors ⅔ and ¾, leading to time compression factors of ⅓ and ⅜ for the chrominance information. The picture information per line period in the time division multiplex coded signal is sequentially composed of the time-compressed luminance information and one of the two associated time-compressed chrominance information components.

In a television receiver the time division multiplex coded signal is derived from the signal received through the transmission channel i.e. the satellite connection, which signal is applied to the associated decoding circuit including shift registers which supplies a time decompression or expansion for the luminance and chrominance information with the aid of synchronizing an identification information and which repeatedly supplies the expanded chrominance information over the subsequent line period.

Instead of a broadcasting transmitter it is feasible to use a consumer television camera which is connectable to a receiver suitable for use in the system described. In this case it is favorable for the sake of costs to have identical encoding and decoding circuits in which inputs and outputs are exchangeable whose encoding or decoding operation only depends on given connections to the circuit. The same applies to the use in tape or record recording and reproducing apparatus and/or transcodingn apparatus for time division multiplex signal transcoding.

SUMMARY OF THE INVENTION

It is an object of the invention to realize a circuit of this type in an integrated embodiment which with given connections and by an exchange of input and output is suitable for both encoding and decoding. To this end, a circuit according to the invention is characterized in that the shift registers in the encoding or decoding circuit, which is constituted as an integrated circuit, are suitable for both series-in, parallel-out and parallel-in, series-out operation, a shift register with the greatest number of register stages which stages are coupled to parallel connections of at least two further shift registers via a through-connection circuit for parallel connection of the register stages in two opposite directions, the series inputs and series outputs of at least the three shift registers each being coupled to a connection terminal of the integrated circuit.

Because of the specific shift register choice and the possible connection thereto, it is achieved in a simple manner that the integrated circuit can be used for both encoding and decoding.

A simple adjusting possibility in the integrated encoding or decoding circuit for the choice of encoding or decoding is achieved in an embodiment which is characterized in that the series inputs of at least the three shift registers are capable of receiving a direct voltage, the absence or presence of a determined direct voltage determining the series-in, parallel-out or the parallel-in, series-out operation, respectively, of the shift registers.

An embodiment of an encoding or decoding circuit according to the invention having a sequential encoding facility is characterized in that the integrated circuit includes a controllable switching circuit having two selection contacts each coupled to an associated connection terminal of the integrated circuit, a master contact coupled to a series input of one of the two further shift registers and a switching control contact coupled to a further connection terminal of the integrated circuit.

An embodiment of an encoding or decoding circuit according to the invention having a sequential decoding facility and a signal repetition is characterized in that the integrated circuit additionally has two series-in, series-out shift registers with a shunt connection, whose series inputs can be alternately connected via associated further controllable switching circuit to the series output of one of the two further shift registers and to a connection terminal of the integrated circuit suitable for direct voltage supply through which the shift register shunt connection is inoperative.

BRIEF DESCRIPTION OF THE DRAWING

The invention will now be described by way of example with reference to the accompanying drawing, the sole FIGURE of which shows a block diagram of an integrated encoding or decoding circuit according to the invention.

DETAILED DESCRIPTION OF THE INVENTION

In the FIGURE the reference IC denotes an integrated circuit which circuit IC has, for example, six shift registers denoted by SR1 to SR6 inclusive. The shift register SR1 has a maximum number of m register stages denoted by 1, 2, 3, ... p ... m. The shift register SR2 has register stages 1, 2, 3, ... p−1, the shift register SR3 has register stages p ... q−1 and the shift register SR4 has register stages q ... m. Parallel connections of the register stages of the shift register SR1 are coupled to parallel connections of correspondingly denoted register stages of the shift registers SR2, SR3 and SR4 via a through-connection circuit SC1. In the through-connection circuit of bidirectional link SC1 on/off switches are shown through which signals can be passed bidirectionally. Depending on the direction of the signal processing the parallel connections to the register stages are operative as input or output connections. This signal processing is effected in shift registers SR1, SR2, SR3 and SR4 under the control of clock pulses (CP) which are applied to clock pulse inputs denoted by double arrow heads. The shift register SR1 receives through connecting terminals of the circuit IC the clock pulses CPIO denoted at this terminal, the shift register SR2 receives clock pulses CPY, the shift register SR3 receives clock pulses CPU(V) and the shift register SR4 receives clock pulses CPV. The values of the clock pulse frequencies of the clock pulses CPY, CPU(V) and CPV relative to CPIO determine in known manner, due to the different write and read rates in the shift registers, the extent of the signal expansion in decoding and signal compression in encoding, respectively. The through-connection circuit SC1 receives a switching signal via a connection terminal of the circuit IC, which signal occurs in a television line blanking period denoted by THB. Furthermore luminance information denoted in the FIGURE by Y and chrominance information components denoted by U and V in the form of color difference signals which are conventionally involved in the use of color television. In a time division multiplex signal the chrominance information components occur in a compressed state, while the luminance information may or may not be compressed.

The FIGURE shows some input and output possibilities for signals at the connection terminals of the circuit IC. It is assumed that a time division multiplex signal VUY or UYVY is applied. The connections to the circuit IC shown in the FIGURE are present for the signal supply UYVY which in accordance with the above cited report is effected in a cycle of two line periods TH. In the FIGURE this is shown by $\overline{UYVY}$ having twice the line period TH. The further assumed time division multiplex signal supply $\overline{VUY}$ is effected, for example, in each line period TH, while the decoding circuit IC applies simultaneous or parallel signals V, U and Y to the connection terminals having the same references. In the case of the time division multiplex signal supply $\overline{UYVY}$ the signals $U,U'$ $V',V$ and $Y$ occur at the connection terminals of the decoding circuit IC having the same references. The primed reference denotes a signal repetition. The sequences of the information components given for the time division multiplex signal have been given by way of example.

If the circuit IC is operative as an encoding circuit, it is assumed by way of example that encoding can be carried out in two manners. When supplied with the simultaneous or parallel signals $\overline{Yc}$, $\overline{Uc}$ and $\overline{Vc}$ the encoding circuit IC applies a time division multiplex signal $\overline{VUYc}$ to a connection terminal thereof. When supplied with the simultaneous signals $\overline{Yc}$, $\overline{Uc}$ and $\overline{Vc}$ the encoding circuit IC applies a time division multiplex signal $\overline{UYVYc}$ to a further connection terminal thereof as is shown in the FIGURE.

The encoding and decoding possibilities in the integrated circuit IC are obtained in a simple manner by its specific structure with the shift registers SR1, SR2, SR3 and SR4 which are suitable for both series-in, parallel-out and parallel-in, series-out operation and the interposed through-connection circuit SC1 for the parallel connection of the register stages in two opposite directions. There should be at least three shift registers (SR1, SR2, SR3), the register SR2 processing the luminance signal Yc or Y and the shift register SR3 processing alternately the chrominance signals Uc and Vc or U and V.

The series register input at the register stage 1 of the shift register SR1 is connected to a connection terminal of the circuit IC which can be connected via a connection shown as a switch S1 to a terminal of a d.c. voltage source another terminal of which is considered to be connected to ground. Likewise, further connection terminals of the circuit IC which are connected to series register inputs of the shift registers SR2, SR3 and SR4 can be connected to the direct voltage terminal through switches S2, S3 and S4, respectively. The series inputs of the shift registers SR1, SR2, SR3 and SR4 are constituted as d.c. voltage inputs, the absence or presence of the determined d.c. voltage determining the series-in, parallel-out and the parallel-in, series-out operation, respectively, of the shift registers. Each shift register SR2, SR3 and SR4 has a single series register output which is connected to a connection terminal of the circuit IC. The shift register SR1 is shown with two series-register outputs which are present at the register stages m and q−1. The register stage q−1 of the shift register SR1 is considered to be provided with an input which is connected to a connection terminal of the circuit IC which can be connected via a switch S5 to the direct voltage terminal. In the open state of the switch S5 the register stage q−1 is normally operative as a shift-through register stage to the subsequent stage q in the shift register SR1, while the ° register stage q−1 is operative as a final register stage in the closed state of the switch S5. The stages q to m inclusive are, for example, rendered inoperative for the signal procession via the switch S5. The open and closed states of the switch S5 are shown by a solid and a dot-and-dash line respectively. During the closed state of switch S5 indicated by the dot-and-dash line a controllable switching circuit SC2 is operative in the circuit IC providing two alternate through-connections indicated by a dotted line and a dashed line. These through-connections are present between two selection contacts each having a connection with the integrated circuit IC and a master contact coupled to the series input of the shift register SR3. The chrominance signals $\overline{Uc}$ and $\overline{Vc}$ are alternately applied per line period TH to the series register input of the shift register SR3 if the switch S3 is open. The switching circuit SC2 is operative under the control of a switching signal to be applied to a switching control contact, which signal is applied to a connection terminal of the encoding circuit IC and whose frequency is denoted by ½FH at this terminal. The switching signal of half the line frequency ½FH is also applied to two controllable switching circuits SC3 and SC4 each likewise having two selection contacts, one master contact and a switching control contact. The series register output of the final register stage q−1 of the shift register SR3 can alternately be connected via the switching circuits SC3 and SC4 per line period TH to the series register inputs of the shift registers SR5 and SR6 respectively. The shift register SR5 or SR6 receives the direct voltage from the voltage source via a connection terminal of the circuit IC if it is not through-connected. The shift registers SR5 and SR6 are each shown with an input register stage p having an external output, the final register stage q−1 being succeeded by an adder stage (+) to which the said external output is connected. Thus the two series-in, series-out shift registers SR5 and SR6 are provided constituted with a shunt between stages p and +. In the presence of the direct voltage at the register stage p of the shift registers SR5 and SR6 the shift register shunt (p to +) is inoperative and the shift register operates as a series register. In the absence of the direct voltage the shift register shunt (p to +) is operative and the signal is directly passed on through the stages p and (+) and at the same time is written in the shift register SR5. The result is that in the decoding circuit IC the shift registers SR5 and SR6 of the series-in, series-out type are operative as delay devices having a delay time which is equal to one line period TH so that the outputs of the adder stage (+) supply the signals $\overline{U,U'}$ and $\overline{V', V}$ under the control of the clock pulses CPU (V). The shift registers SR5 and SR6 and the switching circuit (SC3, SC4) in the integrated circuit IC provide the sequential decoding possibility and signal repetition during decoding.

The manner of operation of the shift registers SR1, SR2, SR3 and SR4 is determined by means of the connections to the d.c. voltage source shown as switches S1, S2, S3 and S4. In the abscence of the direct voltage the shift registers SR1, SR2, SR3 and SR4 are operative as series-in, parallel-out shift registers and in the presence of the direct voltage these shift registers are operative as parallel-in, series-out shift registers, all this under the control of the clock pulses (CP). If the integrated circuit IC is operative as a decoding circuit, the switches S2, S3 and S4 are closed and the switch S1 is open. Depending on the reception of the time division multiplex signal $\overline{VUY}$ or $\overline{UYVY}$ output signals are derived from the shift registers SR2, SR3 and SR4 and from the shift registers SR2, SR3 (internal), SR5 and SR6, respectively. If the integrated circuit IC is operative as an encoding circuit, the switch S1 is closed and the switches S2, S3 and S4 are open. Depending on the choice of the supply of the time division multiplex signal $\overline{VUYc}$ or $\overline{UYVYc}$, the switch S5 is open or closed, respectively.

In the FIGURE the connections shown as switches S1, S2, to S5 inclusive are drawn outside the integrated circuit IC. The embodiment of the integrated circuit IC substantially with the three shift registers SR1, SR2 and SR3 and the interposed through-connection circuit SC1 is the simplest embodiment for both encoding and decoding. The addition in the integrated circuit IC of the switching circuit SC2 for encoding and the switching circuit (SC3, SC4) and the shift registers SR5 and SR6 for decoding provides further applications, likewise as the addition of the shift register SR4 for encoding and decoding. Continuing in this manner it is possible to incorporate one or more of the connections with the switches S1, S2 to S5 inclusive in the integrated circuit IC. It is only important that the series inputs and the series outputs of the shift registers SR1, SR2 and SR3 connected to the through-connection circuit SC1, and possibly the shift register SR4, each have a connection with the integrated circuit IC so that the desired signal input or d.c. voltage supply and signal output can be effected.

In the FIGURE the integrated circuit IC is shown with shift registers SR2, SR3 and SR4 located on one side of the shift register SR1. One or more of the shift registers SR2, SR3 and SR4, with part of the interposed through-connection circuit, may be located on the other side of shift register SR1. Furthermore the integrated circuit IC may include an internal clock pulse source for supplying clock pulses (CP) of the different frequencies.

When two integrated circuits IC are used with the first being operative as a decoding circuit and the subsequent second as an encoding circuit, a transcoding circuit is obtained for transcoding a time division multiplex signal having a given structure into a time division multiplex signal having a different structure.

The possibility of performing encoding as well as decoding with the same design of integrated circuit IC is of economic importance in those cases in which the two signal processing steps occur more or less to the same extent. Possible uses for such an integrated circuit are combinations of color television cameras, possibly with tape or record recording and reproducing apparatus for signal storage and with picture display devices with a display on display screens may be considered.

I claim:

1. An encoding or decoding circuit for encoding from simultaneous signals to a time division multiplex signal or for decoding from the time division multiplex signal to the simultaneous signals, respectively, comprising a signal compression or expansion circuit, respectively, said compression or expansion circuit including at least three shift registers, each individual shift register having one of at least three different sets of write and read rates under the control of clock pulses of different frequencies, characterized in that said encoding or decoding circuit is constituted as an integrated circuit, said shift registers are suitable for both series-in, parallel-out and parallel-in, series-out operation, a first shift register having the largest number of register stages, which stages are coupled to parallel connections of at least a second and a third shift register via a through-connection circuit for parallel, bi-directional connection of the register stages of said first shift register to the other shift registers, the series inputs and series outputs of at least the first, second and third shift registers each being coupled to a separate connection terminal of the integrated circuit.

2. An encoding or decoding circuit as claimed in claim 1, characterized in that the series inputs of at least said first, second and third shift registers are capable of receiving a direct voltage, the absence or presence of a determined direct voltage determining the series-in, parallel-out or parallel-in, series-out operation, respectively, of the shift registers.

3. An encoding or decoding circuit as claimed in claim 1 or 2, characterized in that the integrated circuit includes a controllable switching circuit having two selection contacts, each coupled to an associated connection terminal of the integrated circuit, a master contact coupled to a series input of one of second or third shift registers and a switching control contact coupled to a further connection terminal of the integrated circuit.

4. An encoding or decoding circuit as claimed in claim 2, characterized in that the integrated circuit additionally has two series-in, series-out shift registers with a shunt connection, whose series inputs can be alternately connected via associated further controllable switching circuits to the series output of one of said second or third shift registers and to a connection terminal of the integrated circuit suitable for direct voltage supply through which the shift register shunt connection is in-operative.

* * * * *